US00RE38322E

(19) United States
(12) Reissued Patent
Vermeersch et al.

(10) Patent Number: US RE38,322 E
(45) **Date of Reissued Patent: *Nov. 18, 2003**

(54) HEAT-SENSITIVE IMAGING MATERIAL FOR MAKING LITHOGRAPHIC PRINTING PLATES REQUIRING NO PROCESSING

(75) Inventors: Joan Vermeersch, Deinze (BE); Marc Van Damme, Heverlee (BE); Guy Hauquier, Nijlen (BE)

(73) Assignee: Agfa-Gevaert, Mortsel (BE)

( * ) Notice: This patent is subject to a terminal disclaimer.

(21) Appl. No.: 09/953,945

(22) Filed: Sep. 18, 2001

Related U.S. Patent Documents

Reissue of:
(64) Patent No.: 6,132,934
Issued: Oct. 17, 2000
Appl. No.: 09/241,297
Filed: Feb. 1, 1999

U.S. Applications:
(60) Provisional application No. 60/079,871, filed on Mar. 30, 1998.

(30) Foreign Application Priority Data

Feb. 9, 1998 (EP) ..... 98200372

(51) Int. Cl.[7] ..... G03C 1/494; G03C 1/705; G03F 7/06; G03F 7/004; G03F 7/11

(52) U.S. Cl. ..... 430/302; 430/204; 430/273.1; 430/275.1; 430/276.1; 430/278.1; 430/330; 430/616; 430/964

(58) Field of Search ..... 430/201, 204, 430/273.1, 276.1, 278.1, 275.1, 616, 964, 302, 330

(56) References Cited

U.S. PATENT DOCUMENTS

| | | | | | |
|---|---|---|---|---|---|
| 3,962,513 | A | * | 6/1976 | Eames | 430/201 |
| 5,171,650 | A | * | 12/1992 | Ellis et al. | 430/201 |
| 5,339,737 | A | * | 8/1994 | Lewis et al. | 101/454 |
| 5,353,705 | A | * | 10/1994 | Lewis et al. | 430/273.1 |
| 5,401,611 | A | * | 3/1995 | Edwards, Sr. et al. | 430/616 |
| 5,908,731 | A | * | 6/1999 | Leenders et al. | 430/273.1 |
| 5,916,734 | A | * | 6/1999 | Takagami et al. | 430/273.1 |
| 5,985,515 | A | * | 11/1999 | Van Rompuy et al. | 430/273.7 |
| 6,268,110 | B1 | * | 7/2001 | Gates et al. | 430/616 |

FOREIGN PATENT DOCUMENTS

| | | | |
|---|---|---|---|
| EP | 0 573 092 | * | 12/1993 |
| EP | 0 816 071 | * | 1/1998 |
| GB | 1482665 | * | 8/1977 |

* cited by examiner

*Primary Examiner*—Richard L. Schilling
(74) *Attorney, Agent, or Firm*—Breiner & Breiner, L.L.C.

(57) ABSTRACT

According to the present invention there is provided a heat-sensitive imaging material for making lithographic printing plates which require no processing. The heat-sensitive imaging element comprises on a lithographic base having a hydrophilic surface a metallic or metal oxide layer and on top thereof an [oleophobic] *oleophilic* polymeric layer having a thickness of less than 5 $\mu$m and comprising a polymer containing phenolic groups.

3 Claims, No Drawings

HEAT-SENSITIVE IMAGING MATERIAL FOR MAKING LITHOGRAPHIC PRINTING PLATES REQUIRING NO PROCESSING

Matter enclosed in heavy brackets [ ] appears in the original patent but forms no part of this reissue specification; matter printed in italics indicates the additions made by reissue.

This application claims benefit of Provisional Application Ser. No. 60/079,871 filed Mar. 30, 1998.

FIELD OF THE INVENTION

The present invention relates to a heat-sensitive imaging element for making lithographic printing plates. More specifically the invention relates to a heat-sensitive imaging element which requires no processing.

BACKGROUND OF THE INVENTION

Lithographic printing is the process of printing from specifically prepared surfaces, some areas of which are capable of accepting ink, whereas other areas will not accept ink.

In the art of photolithography, a photographic material is made imagewise receptive to oily or greasy ink in the photo-exposed (negative working) or in the non-exposed areas (positive working) on a ink-repelling background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of stability of sensitivity in view of the storage time and they show a lower resolution. The trend towards heat-sensitive printing plate precursors is clearly seen on the market.

EP-A-444 786, JP-63-208036, and JP-63-274592 disclose photopolymer resists that are sensitized to the near IR. So far, none has proved commercially viable and all require wet development to wash off the unexposed regions. EP-A-514 145 describes a laser addressed plate in which heat generated by the laser exposure causes particles in the plate coating to melt and coalescence and hence change their solubility characteristics. Once again, wet development is required.

EP-A-652 483 discloses a lithographic printing plate requiring no dissolution processing which comprises a substrate bearing a heat-sensitive coating, which coating becomes relatively more hydrophilic under the action of hat. Said system yields a positive working printing plate. EP-A-609 941 describes a heat-mode recording material comprising on a substrate a metallic layer and a thin hydrophobic layer which becomes hydrophilic upon exposure. However the lithographic performance of the obtained printing plate is poor.

OBJECTS OF THE INVENTION

It is an object of the present invention to provide a heat-sensitive imaging element for preparing lithographic printing plates requiring no dissolution processing and having a high lithographic performance (ink acceptance, scratch resistance, durability)

SUMMARY OF THE INVENTION

According to the present invention there is provided a heat-sensitive imaging element for making lithographic printing plates comprising on a lithographic base, having a hydrophilic surface, a metallic layer or metal oxide layer and on top thereof an [oleophobic] *oleophilic* polymer layer having a thickness of less than 5 μm characterised in that said polymer layer comprises a polymer containing phenolic groups.

DETAILED DESCRIPTION OF THE INVENTION

It has been found that according to the present invention, using an imaging element as described above, lithographic printing plates requiring no processing and having an excellent lithographic performance can be obtained.

Metallic layers or metal oxide layers suitable for use in accordance with the invention comprise metals or metal oxides converting the actinic radiation to heat so that the [oleophobicity] *oleophilicity* of the [oleophobic] *oleophilic* top-layer is destroyed. The thickness of the metallic layer or metal oxide layer is preferably from 0.01 μm to 2 μm, and most preferably from 0.05 μm to 1.5 μm. Specific examples of metal layers or metal oxide layers are aluminum, titanium oxide, bismuth and silver of which the three latter are preferred.

A silver layer for use in this invention as the metallic layer can be made according to the principles of the silver complex diffusion transfer reversal process, hereinafter called DTR-process, having been described, e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ('DTR-image') with respect to the black silver image obtained in the exposed areas of the photographic material.

In another method for providing a metal layer on the lithographic base having a hydrophilic surface a silver halide emulsion disposed on a lithographic base having a hydrophilic surface is strongly exposed to actinic radiation and then developed, or otherwise processed to maximum blackness. The black opaque emulsion is converted to a reflective recording material by heating at least to 270° C. in an oxygen containing environment until the emulsion coating assumes a shiny reflective appearance. Such method is disclosed in U.S. Pat. No. 4,314,260.

According to an alternative method for providing a metal layer on the lithographic base the metal is provided using vapour or vacuum deposition.

According to another embodiment of the invention the metallic layer can be a bismuth layer that can be provided by vacuum deposition.

A drawback of the method of preparation of a thin bismuth recording layer by vacuum deposition is the fact that this is a complicated, cumbersome and expensive process.

Therefore, in EP-A-97201282 the vacuum deposition is replaced by coating from an aqueous medium. According to this disclosure a thin metal layer is formed by the following steps:

(1) preparing an aqueous medium containing ions of a metal, (2) reducing said metal ions by a reducing agent thus forming metal particles, (3) coating said aqueous medium containing said metal particles on a transparent support.

As a metal oxide layer preferably a titanium oxide layer is used. This layer can be applied to the substrate by vacuum deposition, electron-beam evaporation or sputtering.

The [oleophobic] *oleophilic* layer provided on top of the metallic layer or metal oxide layer comprises a polymer containing phenolic groups. Preferred polymers containing phenolic groups are phenolic resins (e.g. novolac) or hydroxyphenyl substituted polymers (e.g. polyhydroxystyrenes). The [oleophobic] *oleophilic* layer has a thickness of less than 5 $\mu$m. As a consequence a highly sensitive heat-sensitive imaging element is obtained. The use of a polymer containing phenolic groups furthermore improves the lithographic performance (ink acceptance, scratch resistance, durability) of the lithographic printing plates obtained according to the present invention.

According to one embodiment of the present invention, the lithographic base having a hydrophilic surface can be an anodised aluminum. A particularly preferred lithographic base having a hydrophilic surface is an electrochemically grained and anodised aluminum support. Most preferably said aluminum support is grained in nitric acid, yielding imaging elements with a higher sensitivity. According to the present invention, an anodised aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further increasing treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post treatments may be carried out alone or in combination.

According to another embodiment in connection with the present invention, the lithographic base can comprise a flexible support, such as e.g. paper or plastic film, provided with a hardened hydrophilic layer. A particularly suitable hardened rough hydrophilic layer may be obtained from a hydrophilic binder hardened with a hardening agent such as formaldehyde, glyoxal, polyisocyanate or preferably a hydrolysed tetra-alkylorthosilicate.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers.

A hardened hydrophilic layer on a flexible support used in accordance with the present embodiment preferably also contains substances that increase the mechanical strength and the porosity of the layer e.g. colloidal silica. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. Incorporation of these particles gives the surface of the hardened hydrophilic layer a uniform rough texture consisting of microscopic hills and valleys.

The thickness of the hardened hydrophilic layer may vary in the range of 0.2 to 25 $\mu$m and is preferably 1 to 10 $\mu$m.

Particular examples of suitable hardened hydrophilic layers for use in accordance with the present invention are disclosed in EP-A601 240, GB-P-1 419 512, FR-P-230 354, U.S. Pat. No. 3,971,660, U.S. Pat. No. 4,284,705 and EP-A 514 490.

As support on which the hydrophilic layer is provided it is particularly preferred to use a plastic film e.g. substrated polyethylene terephthalate film, cellulose acetate film, polystyrene film, polycarbonate film etc . . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 m2 per gram, more preferably a surface area of 500 $m^2$ per gram.

In accordance to the method of the present invention for obtaining a lithographic printing plate the heat-sensitive imaging element is image-wise scanning exposed using a laser, preferably a laser that operates in the infrared or near-infrared, i.e. wavelength range of 700–1500 nm. Most preferred are laser diodes emitting in the near-infrared.

After the exposure the imaging element can be used without an additional wet treatment as a lithographic printing plate.

The printing plate obtained according to the present invention can also be used in the printing process as a seamless sleeve printing plate. This cylindrical printing plate wich has as diameter the diameter of the print cylinder is slided on the print cylinder instead of applying in a classical way a classically formed printing plate. More details on sleeves are given in 'Grafisch Nieuws' ed. Keesing, 15, 1995, page 4 to 6.

The following examples illustrate the present invention without limiting it thereto. All parts and percentages are by weight unless otherwise specified.

EXAMPLES

Example 1

Preparation of the DTR Material

On the back of a polyethylene terephthalate support with a thickness of 175$\mu$, was coated a layer from a 11% wt solution in demineralized water (pH=4), with a wet thickness of 50 $\mu$m. The resulting layer contained 74.7% of titaniumdioxide, 8.6% of polyvinylalcohol, 16.2% of hydrolysed tetramethylorthosilicate and 0.5% wetting agents.

On the other side of the polyethylene terephthalate support which is provided with a hydrophilic subbing layer, is first coated a layer from a 20% wt solution in demineralized water pH=4), with a wet coating thickness of 50 $\mu$m. This layer contained 82.7% of titaniumdioxide, 9.1% of polyvinylalcohol, 8.2% of hydrolysed tetramethylorthosilicate and 0.17% of palladiumsulphide (particle size 2–3 nm). On this base layer, a layer of palladiumsulphide particles (2–3 nm) is coated from a 0.24% wt solution (pH=9) in demineralized water, with a wet thickness of 13 $\mu$m. Finally, an emulsion layer and top layer were simultaneously coated by means of the cascade coating technique. The emulsion layer was coated with a wet thickness of 30 $\mu$m and such that the silver halide coverage expressed as $AgNO_3$ was 2.50 g/m$^2$ and the gelatin content was 1.50 g/m$^2$. The toplayer was coated with a wet thickness of 15 $\mu$m such that the gelatin content was 0.7 g/m$^2$. The top layer further contained 61 mg/m$^2$ of Levanyl Rot and 0.14 g/m$^2$ matting agent.

Preparation of the Heat-Sensitive Imaging Element

To obtain a heat-sensitive imaging element according to the present invention, the unexposed DTR material as described above was developed for 12 s at 24° C. in an aqueous alkaline solution having the following ingredients:

| | |
|---|---|
| Anhydrous sodium sulphite | 120 g |
| Sodium hydroxide | 22 g |
| Carboxymethylcellulose | 4 g |
| Potassium bromide | 0.75 g |
| Anhydrous sodium thiosulphate | 8 g |
| Aluminum sulphate.18$H_2O$ | 8 g |
| Ethylene diamine tetraacetic acid tetrasodium salt | 4.2 g |
| Hydroquinone | 20 g |
| Methylfenidon | 6.25 g |
| Demineralized water to make | 1 L |
| pH (25° C.) > 12.5 | |

The initiated diffusion transfer was allowed to continue for 18 s to form a silver layer, whereafter the material was rinsed with water containing 0.03% of trypsine at 50° C.

The thus obtained metallic silver layer was provided with a hydrophobic layer by guiding the material through a finisher at 45° C., having the following composition:

| | |
|---|---|
| Dextran 70000 | 40 g |
| Polyethyleneglycol 200 | 50 ml |
| Sodiumdihydrogenphosphate.2$H_2O$ | 20 g |
| Citric acid | 22 g |
| Potassium nitrate | 12.5 g |
| Sodium hydroxide | 12.6 g |
| 1-phenyl-5-mercaptotetrazole | 0.5 g |
| Biocide | 0.1 g |

-continued

| | |
|---|---|
| Wetting agent | 261.5 mg |
| Demineralized water to make | 1 L |
| pH (25° C.) = 5.95 | |

Exposing the Heat-Sensitive Imaging Element

This material was imaged with:

1. a Gerber C42T™ internal drum platesetter at 275 m/s and 2540 dpi. The power level of the laser in the image plane was 5.4 W.

2. an Isomel diode external drum platesetter at 3.2 m/s and 5 3600 dpi. The power level in the image plane was 253 mW.

Printing the Imagwise Exposed Element

The plates were both printed on a Heidelberg GTO46 printing machine with a conventional ink (Van Son rubberbase) and fountain solution (Rotamatic), resulting in excellent prints without any scumming in the IR-exposed areas and good ink-uptake in the unexposed areas. The printing results with respect to image quality are presented in table 1.

TABLE 1

| Laser | Dot rendering (100$^{th}$ print - 200 lpi) | Dot rendering 40% | 50% | 70% | screen |
|---|---|---|---|---|---|
| Internal drum | 4–91 | 61 | 73 | 91 | |
| External drum | 2–94 | 64 | 75 | 88 | |

Example 2

Preparation of the DTR Material

The DTR material was prepared as described in example 1.

Preparation of the Heat-Sensitive Imaging Element

To obtain a heat-sensitive imaging element according to the present invention, the unexposed DTR material was developed for 12 s at 24° C. in an aqueous alkaline solution as described in example 1.

The initiated diffusion transfer was allowed to continue for 18 s to form a silver layer, whereafter the material was rinsed with water at 50° C.

One of the thus obtained metallic silver layers was used as such, one was coated with a polyethylene layer (2 g/m$^2$) and a 3 th one was coated with a novolac layer (2 g/m$^2$ Alnovol SPN452).

A 4th material was prepared as described in example 1.

Exposing the Heat-Sensitive Imaging Element

The 4 materials were all imaged with a Gerber C42T™ internal drum platesetter at 12,000 rpm (367 m/s, pixel dwell time 0.032 $\mu$s) and 2540 dpi. The power level of the laser in the image plane was 5.4 w.

After imaging, the plates were printed without any additional wet treatment.

Printing the Imagewise Exposed Element

The plates were printed on a Heidelberg GTO46 printing machine under more critical conditions than in example 1 with a conventional ink (K+E) and a fountain solution of 5% G67c (commercially available from Agfa-Gevaert N.V.)+ 10% isopropanol.

The plate that did not get an extra coating layer after developing, did not show any ink-uptake in the unexposed areas and the material prepared as described in example 1 showed a slower ink-uptake while the one with polyethylene as a final coating, resulted in a better ink-uptake and no scumming, but the image was already damaged after 25 prints. Finally the one with the novolac coating on top, showed a good ink-uptake, no scumming and a run-length>3000 prints.

Example 3

Preparation of the DTR Material

The DTR material was prepared as described in example 1 or 2.

Preparation of the Heat-Sensitive Imaging Element

To obtain a heat-sensitive imaging element according to the present invention, the unexposed DTR material was developed for 12 s at 24° C. in an aqueous alkaline solution as described in example 1 or 2.

The initiated diffusion transfer was allowed to continue for 18 s to form a silver layer, whereafter the material was rinsed with water at 50° C.

One of the thus obtained metallic silver layers was used as such, one was coated with a polyethylene layer (1 g/m$^2$), a third one was coated with a novolac layer (1 g/m$^2$ Alnovol SPN452) and the last one was coated with a top layer of a copolymer of polyvinylbutyral, polyvinylalcohol and polyvinylacetate, esterified with trimetillitic acid anhydride (1 g/m$^2$).

Exposing the Heat-Sensitive Imaging Element

The 4 materials were all imaged with a Gerber C42T™ internal drum platesetter at 12,000 rpm (367 m/s, pixel dwell time 0.032 $\mu$s) and 2540 dpi. The power level of the laser in the image plane was 5.4 W.

After imaging, the plates were printed without any additional wet treatment.

Printing the Imagewise Exposed Element

The plates were printed on a Heidelberg GTO46 printing machine with a conventional ink (K+E) and a fountain solution of 5% G67c (commercially available from Agfa-Gevaert N.V.)+10% isopropanol.

The plate that did not get an extra coating layer after developing, did not show any ink-uptake in the unexposed areas. The ones with polyethylene and the one with the copolymer as a final coating, resulted in a good ink-uptake and no scumming, but the image was already damaged after 25–50 prints. Finally the one with the novolac coating on top, showed a good ink-uptake, no scumming and a run-length>3000 prints.

Example 4

Preparation of the DTR Material

The DTR material was prepared as described in example 1 to 3.

Preparation of the Heat-Sensitive Imaging Element

To obtain a heat-sensitive imaging element according to the present invention, the unexposed DTR material was developed for 12 s at 24° C. in an aqueous alkaline solution as described in example 1 to 3.

The initial diffusion transfer was allowed to continue for 18 s to form a silver layer, whereafter the material was rinsed with water at 50° C.

One of the thus obtained metallic silver layers was used as such, three other silver layers were coated with a novolac layer of respectively, 1, 2 and 5 g/m$^2$ Alnovol SPN452.

Exposing the Heat-Sensitive Imaging Element

The 4 materials were all imaged with a Gerber C42T™ internal drum platesetter at 12,000 rpm (367 m/s, pixel dwell time 0.032 $\mu$s) and 2540 dpi. The power level of the laser in the image plane was 5.4 W.

After imaging, the plates were cleaned with a dry cotton pad and subsequently printed.

Printing the Imagewise Exposed Element

The plate that did not get an extra coating layer after developing, showed strong ablation during imaging and no residues were left on the exposed parts. The plates with a novolac coating on top of 1 or 2 g/m$^2$ Alnovol SPN452, ablated as an easily removably yellow powder, while on the one with a 5 g/m$^2$ novolac coating, still ablation residues were found after cleaning.

The plates were printed on a Heidelberg GTO46 printing machine with a conventional ink (K+E) and a fountain solution of 5% G671c (commercially available from Agfa-Gevaert N.V.)+10% isopropanol.

The plate that did not get an extra coating layer after developing, did not show any ink-uptake in the unexposed areas. All three layers with a novolac coating on top, showed a good ink-uptake and a runlength>3000 prints.

What is claimed is:

[1. A heat-sensitive imaging material for making lithographic printing plates comprising on a lithographic base, having a hydrophilic surface, a silver layer or titanium oxide layer and on top thereof an oleophobic polymeric layer having a thickness of less than 5 $\mu$m wherein said polymeric layer comprises a polymer containing phenolic groups.]

[2. A heat-sensitive imaging material according to claim 1 wherein said polymer containing phenolic groups is a phenolic resin or a hydroxyphenyl substituted polymer.]

[3. A heat-sensitive imaging material according to claim 1 wherein said silver layer of titanium oxide layer has a thickness between 0.05 and 1.5 $\mu$m.]

[4. A heat-sensitive imaging material according to claim 1 wherein said lithographic base having a hydrophilic surface is a grained and anodized aluminum support.]

[5. A heat-sensitive imaging material according to claim 4 wherein the lithographic base having a hydrophilic surface is an anodized aluminum support which has been treated with a compound selected from the group consisting of polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.]

[6. A heat-sensitive imaging material according to claim 1 wherein said lithographic base having a hydrophilic surface comprises a plastic support provided with a hydrophilic binder cross-linked by means of a hydrolyzed tetraalkylorthosilicate.]

7. A method for making a lithographic printing plate comprising the step of image-wise exposing to actinic radiation a heat-sensitive element comprising on a lithographic base, having a hydrophilic surface, a silver layer or titanium oxide layer and on top thereof an [oleophobic] *oleophilic* polymeric layer having a thickness of less than 5 $\mu$m wherein said polymeric layer *is not crosslinked and* comprises a polymer containing phenolic groups.

8. A method for making multiple copies of an original comprising the steps of:

image-wise exposing to actinic radiation a heat-sensitive imaging material comprising on a lithographic base, having a hydrophilic surface, a silver layer or titanium oxide layer and on top thereof an [oleophobic] *oleophilic* polymeric layer having a thickness of less than 5 $\mu$m wherein said polymeric layer *is not crosslinked and* comprises a polymer containing phenolic groups, starting printing without an additional wet treatment on the exposed imaging material.

9. A method according to claim 7 wherein said image-wise exposure is carried out by an IR-laser.

* * * * *